United States Patent
Betbeder et al.

(10) Patent No.: US 9,431,987 B2
(45) Date of Patent: Aug. 30, 2016

(54) SOUND SYNTHESIS WITH FIXED PARTITION SIZE CONVOLUTION OF AUDIO SIGNALS

(71) Applicant: Sony Computer Entertainment America LLC, Foster City, CA (US)

(72) Inventors: Laurent Betbeder, Oakland, CA (US); Shehrzad Qureshi, Palo Alto, CA (US)

(73) Assignee: SONY INTERACTIVE ENTERTAINMENT AMERICA LLC, San Mateo, CA (US)

( * ) Notice: Subject to any disclaimer, the term of this patent is extended or adjusted under 35 U.S.C. 154(b) by 305 days.

(21) Appl. No.: 13/910,040

(22) Filed: Jun. 4, 2013

(65) Prior Publication Data
US 2014/0355786 A1  Dec. 4, 2014

(51) Int. Cl.
*G06F 17/15*  (2006.01)
*H03G 9/02*  (2006.01)
*H03G 9/00*  (2006.01)

(52) U.S. Cl.
CPC ............ *H03G 9/02* (2013.01); *H03G 9/005* (2013.01)

(58) Field of Classification Search
None
See application file for complete search history.

(56) References Cited

U.S. PATENT DOCUMENTS

| | | | |
|---|---|---|---|
| 5,502,747 A | 3/1996 | Mcgrath | |
| 5,619,198 A | 4/1997 | Blackham et al. | |
| 5,872,965 A | 2/1999 | Petrick | |
| 6,006,245 A * | 12/1999 | Thayer | 708/404 |
| 6,021,206 A | 2/2000 | Mcgrath | |
| 6,259,795 B1 | 7/2001 | Mcgrath | |
| 6,373,416 B1 | 4/2002 | Mcgrath | |
| 6,389,390 B1 | 5/2002 | Reilly | |
| 6,421,697 B1 | 7/2002 | Mcgrath et al. | |

(Continued)

FOREIGN PATENT DOCUMENTS

| | | |
|---|---|---|
| EP | 1081684 A2 | 3/2001 |
| WO | 9949574 A1 | 9/1999 |
| WO | 03012405 A2 | 2/2003 |

OTHER PUBLICATIONS

"Practical Considerations." Engineering Productivity Tools. Engineering Productivity Tools Ltd., n.d. Web. Sep. 6, 2013.

(Continued)

*Primary Examiner* — David H Malzahn
(74) *Attorney, Agent, or Firm* — Joshua D. Isenberg; JDI Patent (57) ABSTRACT

A method for convolving an input signal with an impulse response function, the impulse response function being partitioned into a plurality of time segments of equal size, the method including transforming a segment of an input signal into the frequency domain to generate a frequency spectrum of the segment of the input signal; multiplying the frequency spectrum of the segment of the input signal with a frequency spectrum of each of the segments of the impulse response function; scaling the results from the multiplication of frequency spectra; accumulating the scaled results; and performing an inverse transform on the accumulated signals to generate a desired convolved signal in the time domain. The scaling includes performing a bitwise shift operation on the multiplication results, and performing the bitwise shift operation includes adding a bit to the multiplication results before the bitwise shift operation. Fast convolution of uniformly partitioned impulse response functions can be achieved by performing scaling of input signals, multiplication, and accumulation using fixed-point arithmetic.

30 Claims, 4 Drawing Sheets

(56) References Cited

U.S. PATENT DOCUMENTS

| | | | |
|---|---|---|---|
| 6,505,223 B1* | 1/2003 | Haitsma | G06T 1/0071 386/E5.004 |
| 6,625,629 B1 | 9/2003 | Garcia | |
| 2006/0051088 A1 | 3/2006 | Lee et al. | |
| 2010/0293214 A1 | 11/2010 | Longley | |
| 2014/0355786 A1* | 12/2014 | Betbeder et al. | 381/98 |

OTHER PUBLICATIONS

Armelloni, E.; Giottoli, C.; Farina, A., "Implementation of real-time partitioned convolution on a DSP board," Applications of Signal Processing to Audio and Acoustics, 2003 IEEE Workshop on. , vol., No., pp. 71,74, Oct. 19-22, 2003.

E. Battenberg and R. Avizienis "Implementing real-time partitioned convolution algorithms on conventional operating systems", Proc. 14th Int. Conf. Digital Audio Effects, pp. 313-320 2011.

Kabal, P., and B. Sayar. "Rounding and Scaling in Fixed-Point FFT Implementations." Rapport Technique De l'INRS-Telecommunications (1985): n. pag. Print.

Torger, A.; Farina, A., "Real-time partitioned convolution for Ambiophonics surround sound," Applications of Signal Processing to Audio and Acoustics, 2001 IEEE Workshop on the , vol., No., pp. 195,198, 2001.

Digital signal processing with V850 and V850E devices. In (2005). Renesas Electronics Corporation.

International Search Report and Written Opinion for International Application No. PCT/US2014/037700, dated Dec. 25, 2014.

* cited by examiner

SOUND SYNTHESIS WITH FIXED PARTITION SIZE CONVOLUTION OF AUDIO SIGNALS

FIELD OF THE DISCLOSURE

The present disclosure relates to signal processing methods and apparatus for performing frequency domain convolution techniques. More specifically, the present disclosure relates to sound synthesis techniques involving the convolution of audio input signals with fixed partition size impulse response functions.

BACKGROUND

Convolution of impulse response functions with an input signals has a wide variety of applications, including, e.g., audio and video signal processing, sonar and radar, and general digital signal processing (DSP) applications. One such example is the convolution of audio signals to simulate the acoustic effect of an environment, whereby a source signal may be convolved with a finite impulse response (FIR) function that models the acoustic response of the environment. A practical application of such audio signal convolution is the real-time synthesis of sounds in a simulation, such as a video game virtual environment, in which a pre-computed impulse response function that models the acoustic characteristics of a virtual room may be convolved with an input source signal in real-time to simulate the virtual environment's acoustics. A variety of conventional techniques are available for performing convolution of such signals.

One such technique is direct convolution in the time domain of the functions corresponding to the input signal and impulse response filter. However, the computational cost of performing such convolution can be very high and the computation time for performing such operations increases linearly with filter length (i.e., $t \propto N^2$, where t is the computation time and N is the filter length or number of sampled points in the impulse response function). As a result, direction convolution in the time domain is unsuitable for many real-time applications, particularly when the impulse response function is of relatively long duration.

In light of the drawbacks associated with direct convolution, a variety of frequency domain techniques have been proposed which involve generating the frequency spectra of the time domain signals in order to take advantage of the concept that convolution in the time domain is replaced with point-wise multiplication in the frequency domain. The computation time scales logarithmically with filter length (i.e., $t \propto N \log_2 N$) rather than linearly, thereby providing a significant computational cost advantage over direct time domain techniques if the sample size is large enough.

Frequency domain convolution techniques typically involve a digitally sampled impulse response function, which may be pre-computed, a digitally sampled input signal, and conversion of the sampled signals into the frequency domain with a discrete Fourier transform (DFT). The DFT is typically performed by using a Fast Fourier Transform (FFT) algorithm on the time domain input signal and impulse response, and each segment of the signal and impulse response may be zero-padded to avoid circular convolution. Point-wise multiplication of the complex valued input signal and impulse response spectra is performed, and the resulting product is converted back to the time domain by an inverse Fast Fourier Transform (IFFT) to generate the desired convolved and filtered signal as a function of time.

A variety of techniques have been proposed for performing frequency domain convolution of impulse functions with input signals. One challenge is that frequency domain convolution introduces an inherent latency since the segment of the input signal must be initially buffered and the frequency bins must be loaded before the convolution operations can be performed. In many real-time applications, it is common to address latency concerns with block processing by partitioning the impulse response function into smaller blocks before performing the frequency domain convolution. However, traditional partitioned methods still suffer from slow performance and/or latency when performing the convolution of long impulse responses.

Accordingly, there is a need in the art for methods and apparatus that perform accurate and fast convolution of a real-time source signal with minimal latency and a low computational cost. It is within this context that the present disclosure arises.

BRIEF DESCRIPTION OF THE DRAWINGS

Aspects of the present disclosure can be readily understood by considering the following detailed description in conjunction with the accompanying drawings, in which.

DETAILED DESCRIPTION

According to aspects of the present disclosure, it has been recognized that memory resources, as opposed to processing power, is responsible for slow performance and bottlenecking when attempting to convolve input signals with impulse response functions in many signal processing applications. Bottlenecking can be particularly likely in sound synthesis applications operating in environments highly taxed for computing resources, such as video game consoles. In many traditional methods, parts of convolution operations, such as scaling of input signals, and multiply and accumulate operations, are commonly performed using floating point arithmetic. However, these operations can cause a bottleneck because the floating point calculations can be computationally demanding and require a large amount of memory resources. Accordingly, it would be desirable to perform these operations using fixed-point arithmetic in order to obtain improved memory performance associated with this data format.

In implementations of the present disclosure, operations associated with the convolution of input signals with impulse response functions can be performed using fixed point arithmetic, such as 16-bit integer numbers, in order to provide faster performance of the convolution with minimal latency. Accordingly, implementations of the present disclosure can perform complex multiplication and other operations associated with the convolution of source signals and impulse response filters using fixed point numbers to improve memory performance. By way of example, and not by way of limitation, computational speed of the convolution may be improved by a factor of 8 by achieving 2× reduction in memory footprint and a 4× reduction in memory bandwidth by performing convolution operations using fixed point numbers.

According to aspects of the present disclosure, in order to perform the convolution using fixed point arithmetic, data in floating point format is converted to fixed point format, such as, e.g., converting from 32-bit floating point format to 16-bit integer, before convolving the signals with multiply and accumulate operations of the input signal and impulse response in the frequency domain. One challenge associated with performing these operations using fixed point format is that the source signals need to be scaled appropriately, and the selection of an appropriate scaling factor is particularly critical when using fixed point format in order to make full use of the range of values that can be represented by the fixed integer and minimize precision loss.

Another challenge with using fixed point numbers is that the products of the complex multiplication need to be rounded due to the finite precision of the fixed point format and the range of values that can be represented by data format used. However, truncating the scaling results and the products of the multiplication can produce undesirable truncation noise (i.e., truncating the results of the finite precision calculations introduces a consistent bias because the rounding is asymmetrical). This type of truncation noise may be analogous to introducing a DC offset to the system, and may manifest itself as block edge artifacts that can be heard as a series of audible clicks at the boundaries between time segments when the signals are reproduced in the time domain.

It is noted that many traditional techniques compound scaling for the FFT and IFFT sides. Implementations of the present disclosure, by contrast, can perform scaling differently on the input and output sides by scaling the results of complex multiplication before accumulation when convolving the source signal and impulse response filters in the frequency domain. According to aspects of the present disclosure, the scaling can be performed in a manner that symmetrically rounds the products to avoid the buildup of truncation noise when performing the operations using fixed point numbers.

Further aspects of the present disclosure will be understood with the following detailed description of illustrative implementations of the present disclosure. In order to illustrate various aspects of the present disclosure, implementations may be described herein with reference to conversion from 32-bit floating point format to 16-bit integer, and the convolution of one source signal with one FIR filter using 3 partitions of the impulse response function of fixed size k. However, it will be understood that implementations of the present disclosure are not so limited, and can include, e.g., multiple channel and/or multiple instance convolution, various system information capacities, and various numbers of partitions and partition sizes.

Figure 1A:
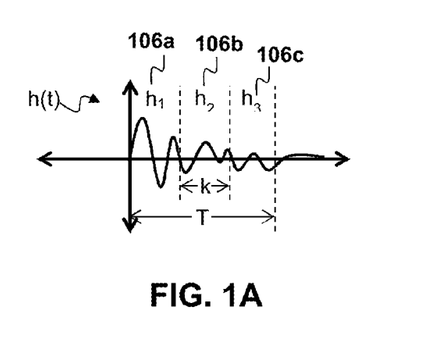
FIG. 1A depicts a uniformly partitioned impulse response function according to aspects of the present disclosure.
Figure 1B:
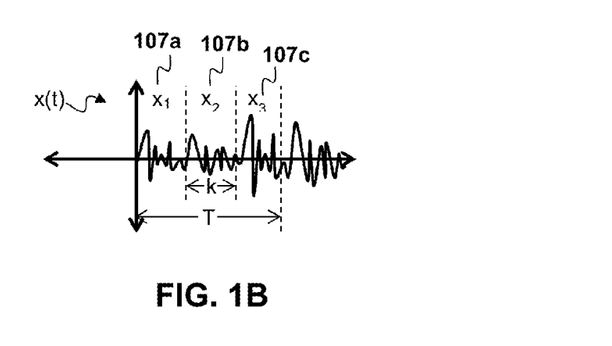
FIG. 1B depicts a uniformly partitioned input signal according to aspects of the present disclosure.
Figure 1C:
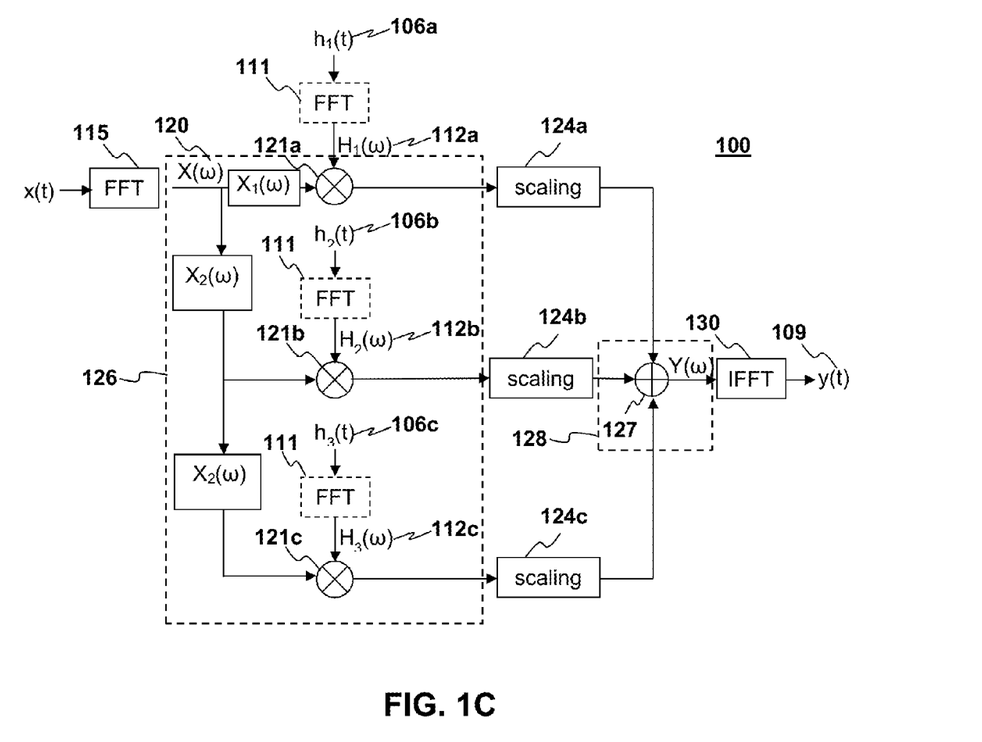
FIG. 1C depicts a convolution method between an input signal and the impulse response function of FIG. 1A according to aspects of the present disclosure.

An implementation of the present disclosure is depicted in FIGS. 1A-1C. In FIG. 1A, a finite impulse response (FIR) function h(t) of length T is uniformly partitioned into a plurality of time segments $106a$, $106b$, $106c$ of a fixed size k. By way of example, and not by way of limitation, the partition length k may be the number of sampling points in a digitally sampled signal. As seen in FIG. 1B, an input signal x(t) 107 of length T may be uniformly partitioned into a corresponding plurality of time segments $107a$, $107b$, $107c$. For simplicity, the input signal x(t) 107 may likewise be partitioned into time segments of the same partition length k. However, aspects of the present disclosure are not limited to such implementation. Alternatively, one partition length $k_1$ may be used for the FIR time segments $106a$, $106b$, $106c$ and a different partition length $k_2$ may be used for the input signal time segments $107a$, $107b$, $107c$.

FIG. 1C illustrates a method 100 for convolving the input signal x(t) 107 of FIG. 1B with the partitioned impulse response function h(t) of FIG. 1A in order to produce a desired output signal y(t) 109 according to various aspects of the present disclosure. By way of example, and not by way of limitation, the input signal 107 may be a real-time stream of sounds within a virtual environment (e.g., a video game), and the impulse response functions $106a$-$106c$ may model the impulse response of the environment (e.g., a simulated room). Accordingly, the output signal 109 may correspond to a synthesized sound that takes into account the acoustic effect of the environment (e.g., room reverberations, echoes, etc.) on the input signal 107. For the sake of clarity, FIG. 1C omits a pre-FFT zero padding of both input and IR partitions. However, such padding may be implemented to avoid circular convolution so that each partition can overlap with the next one.

In the illustrated implementation, the IR function is partitioned into the 3 segments $h_1(t)$ 106a, $h_2(t)$ 106b, and $h_3(t)$ 106c for the sake of simplicity in illustrating various aspects of the present disclosure. Furthermore, in the illustrated implementation, the method 100 includes performing an FFT 111 on the partitioned impulse response function h(t) in order to generate a corresponding frequency spectrum $H(\omega)$ 112a-c for each IR partition. However, it is noted the present disclosure is not limited to these illustrative aspects. For example, in some implementations, the impulse response function h(t) 106a-c may be pre-computed, and the frequency spectra $H(\omega)$ 112a-c for the impulse response function may also optionally be pre-computed. The multiply and accumulate may be expressed mathematically in the form like $H_1(\omega)X_1(\omega)+H_2(\omega)X_2(\omega)+H_3(\omega)X_3(\omega)$, where the operations are understood to be complex point-wise multiply accumulate operations.

In FIG. 1C, the impulse response function h(t) 106a-c is convolved with an input signal x(t) 103 using a frequency domain block processing technique having a partitioned impulse response filter to reduce latency, and the partition length k may be selected depending on system scheduling requirements. The method 100 may include performing an FFT 111 on each time segment, $h_1(t)$ 106a, $h_2(t)$ 106b, $h_3(t)$ 106c, of the impulse response function in order to transform the signal from the time domain into the frequency domain and generate a corresponding frequency spectrum, $H_1(\omega)$ 112a, $H_2(\omega)$ 112b, $H_3(\omega)$ 112c, for each time segment. An FFT 115 may also be performed on each time segment of the input signal x(t) 103 in order to transform each segment from the time domain into the frequency domain, thereby loading the frequency bins and generating a corresponding frequency spectrum $X(\omega)$ 120, which may be made up of corresponding spectra $X_1(\omega)$, $X_2(\omega)$, $X_3(\omega)$ for each time segment $x_1(t)$ 107a, $x_2(t)$ 107b, $x_3(t)$ 107c, of the input signal 107. The inputs to each FFT 111, 115 may be zero-padded in order to avoid drawbacks associated with circular convolution. An appropriate scaling factor may also be applied to FFTs in order to scale the Fourier coefficients of the FFTs 111, 115 as needed.

According to aspects of the present disclosure, the scaling of the input signal FFT coefficients may be handled differently from the scaling of the IR FFT coefficients. By way of example, and not by way of limitation, the IR FFT coefficients may be scaled (as a whole) by a single floating point normalizer to a −32 k+32 k range (fixed point 1:15 normalization) to maximize the dynamic range and allow IR cross-fading at runtime. The input signal FFT coefficients may be scaled by a power of 2 factor per partition, which allows fast integer denormalization via a right shift and provides headroom to accumulate in 32 bit integer.

In the illustrated method 100, multiply and accumulate operations are then performed on the scaled down frequency domain data 120 and 121a-c. First, spectral multiplication of the transformed signals 120 and 112a-c may be performed by way of complex multiplication 121a-c. Each slice of impulse response function $H(\omega)$ corresponds to a time segment of the impulse response function h(t), and complex multiplication 121a-c is performed between each slice 112a-c of the impulse response function with each input slice 120 in order to generate the desired signal for the entire length T of the filter. The method 100 may then include scaling 124a-c of the complex multiplication results and then accumulating the scaled results 127. In the method 100 illustrated in FIG. 1C, scaling 124a-c of the results of the complex multiplication is performed before accumulation 127. An IFFT 130 may then be performed on the accumulated data in order to transform the signal from the frequency domain into the time domain and generate the desired time domain signal y(t) 109. The IFFT may utilize an appropriate scale factor in order to re-scale the IFFT results to the appropriate level for the desired signal 109. By way of example, and not by way of limitation, the output signal y(t) 109 may be a synthesized sound for a real-time input stream of sounds that includes the acoustic effect of an environment on the input signal x(t) 107.

According to certain aspects of the present disclosure scaling of the FFT of the input signal is done in float, scaling of the complex multiply done in fixed-point, IR scaling of the FFT of the IR is done in float, and scaling of the IFFT 130 done in float.

The scaling 124a-c shown in FIG. 1C is the post complex multiply denormalization scaling (i.e., down scaling) of each partition individually. This scaling only accounts for the input signal scaling. The IR denormalization (down) scaling is done after the accumulation process (this is why this scaling is for the whole IR), during the conversion back to float just before the final IFFT. The IFFT scaling is also taken into account at this stage.

According to aspects of the present disclosure a rounding trick may be used for the input partition scaling that is applied to the result of the complex multiply. Specifically, since this scaling is a divide by a power of 2 on integer data, we do an arithmetic right shift.

The rounding trick may also be applied to the per partition scaling of the IR(s) when a volume envelope is applied to a single IR or when doing a cross-fade between 2 IRs before the complex multiply and accumulate.

In the illustrative method 100, scaling of the input signal segments, complex multiplication 121a-c, scaling of the results 124a-c, and accumulating 127 may be performed using fixed integer numbers in order to improve computation speed by decreasing memory resource requirements of the operations. The scaling of the input signal segments is performed on the result of the complex multiplication because complex multiplication is associative, i.e., (k*A)*B=k*(A*B). By way of example, when the complex multiplication is performed on two 16-bit integers, the result is a 32-bit integer. The result is shifted right before accumulating to avoid 32-bit overflow while accumulating.

Scaling of the pre-computed impulse response function and scaling of the IFFT 130 may each be performed in one floating point operation. In certain implementations, the conversion from floating point to integer format may generally involve converting a number from a B-bit floating point format to a B/2-bit integer format, where B represents a number of bits. By way of example, and not by way of limitation, the fixed-point integer operations may be performed using 16-bit integer numbers by converting the data from 32-bit float to 16-bit integer before performing scaling of the input signal segments, multiplying, and accumulating. Accordingly, the results of the complex multiplication 121a-c may be 32 bit integer numbers.

In alternative implementations, the floating point numbers may be converted from 32-bit float to other integer formats, e.g., 8-bit, 12-bit, 18-bit or 20-bit. It is also noted that the impulse response functions may be in other floating point formats, e.g., 64-bit, etc.

In the implementation depicted in FIG. 1C, improved memory performance can be achieved by performing the operations using fixed point data types because accumulation 127 is not performed in a delay line 126, but rather can be performed in a separate buffer 128. In addition, overflow may be avoided because the accumulation involves adding a number bits, e.g., 32 bits, shifted by a part of the scaling. In a purely fixed-point implementation, the buffer or buffers used for the scaled multiplication results 124a-124c are of a different width than the buffers used for the $H(\omega)$ 112a-112c for each IR partition and the buffers used for the complex multiplication 121a-121c. By way of example and not by way of limitation, the buffers used for scaling the multiplication results 124a-124c and the accumulating 127 may be 32 bits wide, while the buffers used for the $H(\omega)$ 112a-112c and the buffers used for the complex multiplication 121a-121c may be 16 bits wide. In such an example, if the accumulation 127 were to be performed in the delay line 126 the complex multiplications would be accumulated into each $X_i(\omega)$ overwriting them and forcing the use of 32-bit storage for the accumulation. When performing multiplication and accumulation of 16-bit complex numbers, the result has to be stored as a 32-bit number. Using a separate scratch buffer allows us to use 16-bit storage for the input signal history $X(\omega)$ instead of 32-bit storage. This cuts the required memory footprint by half and reduces the required memory bandwidth about a factor of four (4).

One challenge that is particularly problematic when performing the calculations using an integer representation, as opposed to a floating point representation, as in the above described implementation, occurs when the scaled signals and/or the results of the complex multiplication need to be rounded. By way of example, and not by way of limitation, the integer domain may need to be scaled when applying a volume envelope on the IR and/or crossfading of two IRs. In such cases, each partition may be scaled by a factor between 0 and 1 before the complex multiplication. Another example in which the integer domain might need to be scaled occurs when denormalizing scaling of the input signal $X(\omega)$ is applied to the result of each complex multiplication before accumulating.

The rounding presents a problem because it is implemented by an arithmetic shift right, which basically truncates the results of finite precision calculations. However, truncating the results of the finite precision calculations leads to asymmetrical rounding that generates undesirable truncation noise. This type of truncation noise can introduce a consistent bias to the system that is analogous to a DC offset. This may manifest itself as block edge artifacts at the boundaries between time segments when the results are converted to the time domain by an IFFT, and, by way of example, may be heard as a series of clicks in a synthesized audio signal. Truncation noise generated by asymmetrical rounding can be seen by the following example, whereby the bits representing the number after the decimal are truncated, leading to asymmetrical rounding:

$$0.2 \rightarrow 0$$

$$0.8 \rightarrow 0$$

In implementations of the present disclosure, this challenge can be overcome by adding a bit right before a shift that performs the scaling. This can turn a bitwise shift operator, i.e. logical or arithmetic shift, into a round-to-nearest so that rounding of the results is done symmetrically to avoid truncation noise. The effect can be seen by the following example, whereby the added bit corresponds to ½ of the least significant bit after the shift operation, thereby resulting in the shifted number being rounded to the nearest integer:

$$(0.2+0.5) \rightarrow 0$$

$$(0.8+0.5) \rightarrow 1$$

Accordingly, in implementations of the present disclosure, scaling may be performed using numbers in fixed-point format by way of a bitwise shift operator that scales the numbers by a power of 2 and avoids the generation of truncation noise. Accordingly, the numbers may be converted from a floating point format to a less computationally demanding fixed-point format before performing scaling of the input slices. By way of example, and not by way of limitation, the scaling may be performed using 16-bit integer numbers by converting the data from 32-bit floating point format to 16-bit fixed point format before scaling each input slice. A scaling factor for the operation may be calculated and a next power of 2 may be determined in order to determine the number of bit positions to shift for performing the desired scaling.

Generally, the scaling factor may be related to the length of the partition size k, and may vary depending on the characteristics of the signal. For example, for an input signal having a pure waveform whose energy is concentrated in a small number of frequency bins, such as a sine wave, a scaling factor of k/2 can be used. Such a scaling factor, when applied to real-world signals whose energy will not be concentrated, would not work well as it would generate a large amount of quantization noise. Normalizing the IR spectrum $H(\omega)$ allows use of all the dynamic range offered by 16-bit storage. Since the IR is a finite length filter it can be analyzed offline to determine a precise float scaling factor for the whole file. Since the input signal x(t) is infinite in length, one can compute an individual scaling factor for each partition and since that factor is going to be applied in the integer domain after the complex multiplications, one can find the next power of 2 greater than the factor so a shift may be used instead of an integer divide, which is very slow.

At another extreme, for a noisy input signal having energy spread out over a large number of frequency bins, a scaling factor of $\sqrt{k}$ would be more appropriate. In real world applications, the scaling factor selected is likely to be somewhere between these extremes based on the characteristics of each input segment, and it should be selected to find a best fit for the particular signal. It is noted the selection of an appropriate scaling factor is particularly critical when using fixed point format in order to make full use of the range of values that can be represented by the bit width resolution, so as to minimize precision loss.

In order to calculate the best fit for the scaling of each input slice, implementations of the present disclosure can calculate a peak P of the FFT results for each input signal segment $X_i(\omega)$. The FFT can be generally scaled to the magnitude of that frequency by finding the next power of 2, which will be called $P_o$. By way of example, and not by way of limitation, scaling of the input slice in 16-bit integer may be performed by a logical shift represented by:

$$\text{Shift}=15-\log_2(P_o)$$

However, this type of truncation would lead truncation noise as described above due to a consistent bias being applied by the shift. In order to avoid such truncation noise, implementations of the present disclosure may turn a bitwise shift operation into a round-to-nearest by adding a bit right before the shift. This may be accomplished by adding the following bit before performing the above shift:

$$1<<(\text{shift}-1)$$

By adding the above bit, shifted to the corresponding location, a subsequent bitwise shift operation that performs the scaling, e.g. an arithmetic right shift, can be converted into a round-to-nearest because the added bit is analogous to adding ½ of the least significant bit after the shift is performed.

It is noted that in the context of the foregoing discussion, the shift is arithmetic because the integer data being shifted is signed data. Referring again the example of 16-bit signed integer storage of complex data gives us a 15-bit magnitude range (absolute). The complex spectrum values before scaling are dependent on the FFT length which is twice the partition length k, and the nature of the signal (sine versus noise energy distribution). In a case having a choice of allowed partition lengths, the input signal's spectrum $X(\omega)$ is scaled up before storage in the frequency delay line 126 so that it can be scaled down after the multiplications to recover enough headroom to accumulate. It is noted that for 16-bit signed integer data, this method only works up to a partition length limit of $(1<<(15-1))=16384$ samples because beyond that, one would be scaling down to normalize and scaling back up to denormalize after the multiplications. Consequently, there would not be any headroom to accumulate in 32-bit integer.

Figure 2A:
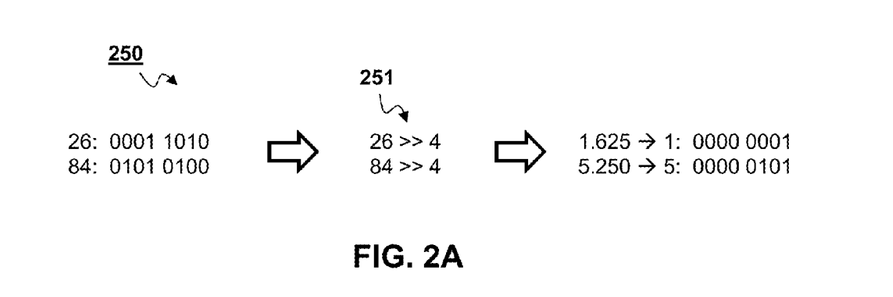
FIGS. 2A-2B depict examples of scaling operations that are illustrative of aspects of the present disclosure.
Figure 2B:
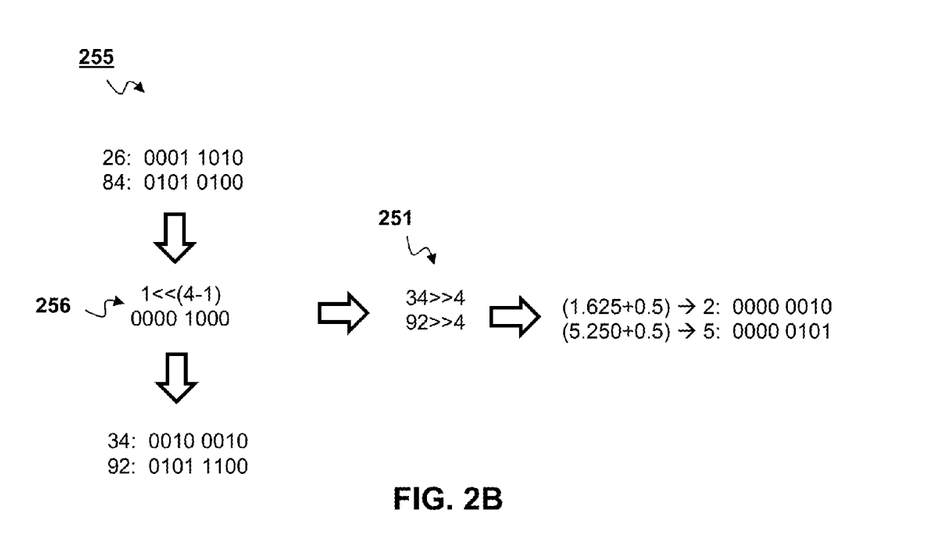

An illustration of how adding a bit can convert an arithmetic shift into a round-to-nearest is depicted in FIG. 2A and FIG. 2B. The numbers depicted in the example of FIG. 2A and FIG. 2B are arbitrarily selected 8-bit fixed integers in order to illustrate in simplified terms how the arithmetic shift is converted into a round-to-nearest.

In the first example 250, shown in FIG. 2A, a right shift 251 of 4 bit positions is depicted corresponding to a scaling down of the numbers by a factor of $2^4=16$. This first example illustrates the generation of truncation noise without adding a bit before the shift. The numbers 26 and 84 have been arbitrarily selected and are depicted in binary as 8-bit integers. Scaling these numbers down by a scale factor of 16 should give results of 1.625 and 5.25, respectively. However, because performing a bitwise shift of these numbers causes the right-most bits to drop out, the truncation causes these numbers to always be rounded down. Accordingly, the rounding is not always symmetrical and generates a consistent bias in one direction that is equivalent to a DC offset.

In the second example 255, shown in FIG. 2B, the same shift 251 is depicted, but a bit is added 256 right before the shift, thereby turning the truncation of the same bitwise shift into a round-to-nearest. Once the desired shift is calculated, in this example a right shift of 4, the bit is added to the appropriate bit position before the shift in order to convert the shift into a round-to-nearest. This bit position can be calculated as being n places to the left of the least significant bit, where n is 1 less than the calculated shift (i.e., n=(shift−1)). Accordingly, the bit can be added by shifting 1 to the left by n and adding that bit to the numbers before scaling (i.e., 1<<(shift−1)) can be added to the numbers before performing the shift). In the illustrated example involving a 4-bit shift, the bit 1<<(4−1), or 1 shifted to the left 3 positions is added to the numbers before scaling. As can be seen in this second example, when the same numbers from the first example are scaled by a bitwise right shift of 4 positions, truncation of the last 4 bit positions causes them to be rounded to the nearest integer due to the added bit.

Figure 3:
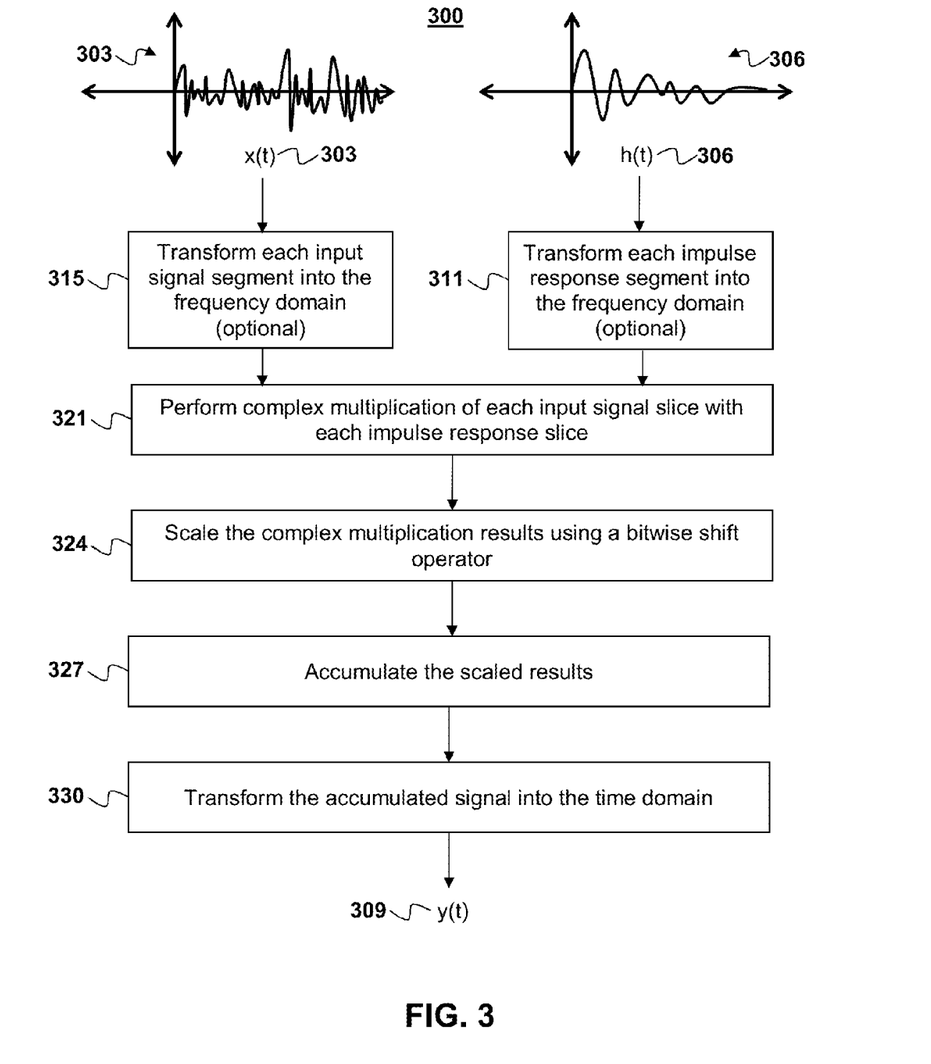
FIG. 3 depicts a flow diagram of a convolution method according to aspects of the present disclosure.

Turning to FIG. 3, a flowchart depicting an implementation of the present disclosure is depicted. FIG. 3 depicts a method 300 for performing convolution of an input signal with a uniformly partitioned impulse response according to aspects of the present disclosure.

In the illustrated implementation, an input signal x(t) 303 is convolved with an impulse response function h(t) 312 using a frequency domain block processing technique in order to generate a desired signal y(t) 309. The partitioned IR function h(t) 312 may be uniformly partitioned into a plurality of segments of a fixed size k. In implementations of the present disclosure, the input signal x(t) may be a real-time audio stream each segments of which is convolved with each IR segment in real-time.

In the method 300, each segment of the input signal x(t) 303 may be transformed into the frequency domain at 315, e.g., by an FFT, in order to load frequency bins and generate a spectrum of the signal for that segment. Each segment of the impulse response function h(t) 306 may also be transformed into the frequency domain at 311, e.g., by an FFT, in order to load frequency bins and generate a spectrum of the impulse response signal for that segment. In implementations of the present disclosure, the IR function may optionally be pre-computed and the FFT of the IR function may also optionally be pre-computed. Each segment may also be zero-padded (not pictured) before performing the FFTs in order to avoid circular convolution. In implementations of the present disclosure, scaling of the results of the FFT 311 for the pre-computed impulse response function may be performed using a floating point operation, while scaling of the input slices from the FFT 315 may be performed by a bitwise shift operation in fixed-point format according to aspects of the present disclosure.

Multiply and accumulate operations may then be performed on the signal data. In implementations of the method 300 depicted in FIG. 3, the multiply and accumulate operations may be performed using a fixed point data type in order to preserve memory resources and provide faster performance.

Complex multiplication 321 of each input slice $X(\omega)$ may be performed with each slice of the impulse response $H(\omega)$, whereby each frequency domain slice may correspond to a spectrum of a time segment of its original time domain signal. The results of the complex multiplication 321 may be scaled at 324 by an appropriate scaling factor determined based on the length of the input segment and the characteristics of the underlying signal. In implementations of the method 300, the scaling may be performed by way of a bitwise shift in order to implement a scaling by a power of two corresponding to the number of bit positions shifted.

After scaling 324, the results are accumulated at 327. According to aspects of the present disclosure, accumulation 327 may be performed after scaling of the results of the complex multiplication. Accordingly, improved memory performance may be achieved because, rather than performing accumulation in the delay line, the accumulation may be performed in a separate buffer.

In implementations of the illustrated method 300, complex multiplication 321, scaling 324, and accumulation 327 may be performed using a fixed point data type. By way of example, and not by way of limitation, these operations may be performed in 16 bit integer by converting spectral data from 32-bit float format into 16-bit integer format before performing these operations. Accordingly, the results of the complex multiplication may be 32-bit integer numbers.

After accumulation 327, the accumulated results may be transformed back into the time domain, e.g., by an IFFT, at 330. The output of the IFFT 330 generate the desired convolved signal y(t) 309. It is noted that the numbers may be converted back to 32-bit floating point format after accumulation. Accordingly, scaling of the IFFT may be done in one floating point operation. Likewise, scaling of the pre-computed IR may be performed in one floating point operation.

The method 300 may further be configured to deal with a changing impulse response on the fly. By way of example, and not by way of limitation, for an implementation synthesizing sounds in a virtual environment, a user may walk through a door or destroy a wall, causing the impulse response function of the environment to change. The method can be modified to apply cross-fading of two impulse response functions in order to deal with the changing impulse response of the environment by cross-fading two impulse response function. For example, the system may apply scaling of a linear combination of two or more impulse response functions before performing the complex multiplication.

By way of example and not by way of limitation, if the integer representation of the FFT of the input signal segment $X_i(\omega)$ is a 16-bit representation, the linear combination of the two IRs (or just the scaling of a single IR with a volume envelope) must be done 100% in the 16-bit integer domain on normalized spectrum data. Otherwise, the data would have to be converted to float and one would lose half the speed. To avoid this the same linear combination formula used to compute the combined gain may be used to denormalize the accumulation result in the floating point domain.

By way of example, and not by way of limitation, suppose an implementation that crossfades between to impulse responses, $IR_a$ and $IR_b$. In this example, $IR_a$ is scaled by a factor $K_a$ and $IR_b$ is scaled by a factor $K_b$. As crossfading is performed between $IR_a$ and $IR_b$ the combined impulse response IR may be expressed as:

$$IR = x \cdot IR_a + (1-x) \cdot IR_b, \text{ where } 0 \leq x \leq 1.$$

A scaling factor K that is used to denormalize the accumulation result may be expressed as:

$$K = x \cdot K_a + (1-x) \cdot K_b.$$

Figure 4:
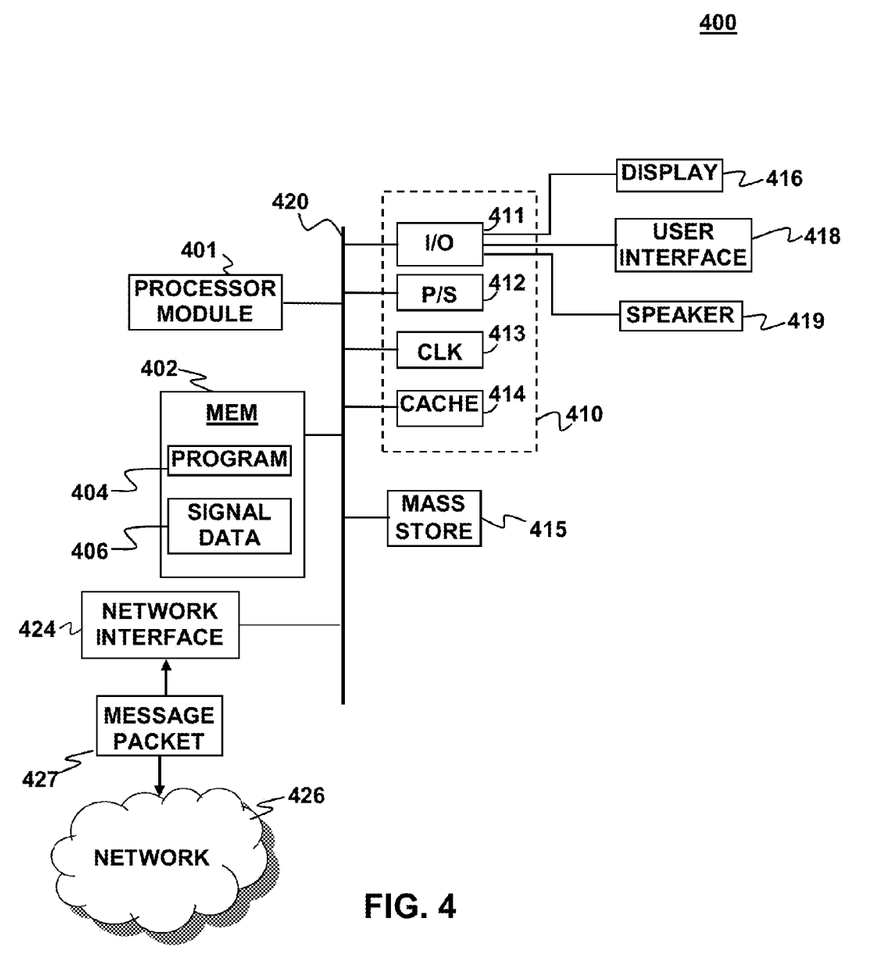
FIG. 4 depicts a system for performing convolution according to aspects of the present disclosure.

Implementations of the present disclosure can further include systems and apparatus for performing convolution methods in accordance with various aspects of the present disclosure. A signal processing system 400 according to aspects of the present disclosure is depicted in FIG. 4.

The system 400 may include a processor 401 and a memory 402 (e.g., RAM, DRAM, ROM, and the like). In addition, the signal processing system 400 may have multiple processors 401 if parallel processing is to be implemented. The memory 402 includes data and code configured as described above. Specifically, the memory 402 may include signal data 406 which may include, e.g., digital representations of one or more pre-computed impulse response functions and digital representations of input sounds that may be generated within a simulated virtual environment.

The system 400 may also include well-known support functions 410, such as input/output (I/O) elements 411, power supplies (P/S) 412, a clock (CLK) 413 and cache 414. The system 400 may optionally include a mass storage device 415 such as a disk drive, CD-ROM drive, tape drive, or the like to store programs and/or data. The system may also optionally include a display unit 416 and user interface unit 418 to facilitate interaction between the system 400 and a user. The display unit 416 may be in the form of a cathode ray tube (CRT), flat panel screen, touch screen, or other display that displays text, numerals, graphical symbols, or other images. The user interface 418 may include a control pad, keyboard, mouse, joystick, light pen, touchscreen, or other device. In addition, the user interface 418 may include a microphone, video camera or other signal transducing device to provide for direct capture of a signal to be analyzed, e.g. an input signal to be convolved. The system 400 may also include a speaker 419 for playing synthesized and convolved sounds generated by methods described herein, as well as other audio signals. The processor 401, memory 402 and other components of the system 400 may exchange signals (e.g., code instructions and data) with each other via a system bus 420 as shown in FIG. 4.

As used herein, the term I/O generally refers to any program, operation or device that transfers data to or from the system 400 and to or from a peripheral device. Every data transfer may be regarded as an output from one device and an input into another. Peripheral devices include input-only devices, such as keyboards and mouses, output-only devices, such as printers as well as devices such as a writable CD-ROM that can act as both an input and an output device. The term "peripheral device" includes external devices, such as a mouse, keyboard, printer, monitor, microphone, game controller, camera, external Zip drive or scanner as well as internal devices, such as a CD-ROM drive, CD-R drive or internal modem or other peripheral such as a flash memory reader/writer, hard drive.

The processor 401 may perform digital signal processing on signal data 406 as described above in response to the data 406 and program code instructions of a program 404 stored and retrieved by the memory 402 and executed by the processor module 401. Code portions of the program 404 may conform to any one of a number of different programming languages such as Assembly, C++, JAVA, or a number of other languages. The processor module 401 forms a general-purpose computer that becomes a specific purpose computer when executing programs such as the program code 404. Although the program code 404 is described herein as being implemented in software and executed upon a general purpose computer, those skilled in the art will realize that the method of task management could alternatively be implemented using hardware such as an application specific integrated circuit (ASIC) or other hardware circuitry. As such, it should be understood that embodiments of the invention can be implemented, in whole or in part, in software, hardware or some combination of both.

In one embodiment, among others, the program code 404 may include a set of processor readable instructions that implement a method having features in common with the method 100 depicted in FIG. 1C or the method 300 of FIG. 3. The program code 404 may generally include one or more instructions that direct the one or more processors to perform a method for convolving one or more input signal segments with one or more impulse response functions using fixed partition size frequency domain techniques. The instructions of the code 404 may cause the processor module 401 to, when executed, transform an input signal segment into the frequency domain, e.g., by executing FFT operations on the time domain input signal, and transform the partitioned impulse response function, e.g., by executing FFT operations on the time domain impulse response signal. The instructions may also cause the processor 401 to perform complex multiplication of the spectral data by multiplying each transformed input signal slice with each transformed impulse response slice. The processor may scale the results of the complex multiplication before accumulating by performing suitable shift operations in accordance with various aspects of the present disclosure. The instructions may also cause the processor to accumulate the results after they are scaled and transform the resulting product back into the time domain in order to generate the desired signal. The instructions may also cause the processor to reproduce the data in an peripheral device, e.g., by playing an audio signal through the speaker 419.

The system 400 may also include a network interface 424 to enable the system 400 to communicate with other devices over a network 426, such as the internet. By way of non-limiting example, in some implementations, the system 400 may be a local video game console configured to enable a user to play games over the network, and convolution methods can be performed locally on the console. In yet further implementations, the system 400 may be a cloud based server configured to perform convolution and video game operations and stream that data to a cloud based user to the user's local console over the network 426. For cloud based computing methods, it may be desirable to use smaller block sizes for the portioned impulse response function and/or impulse response segments in order to minimize latency.

While various aspects of the present disclosure have been described with reference to sound synthesis methods and apparatus, it will be understood that implementations of the present disclosure can include a variety of other methods and apparatus. By way of example and not by way of limitation, implementations of the present disclosure can include radar applications and general digital signal processing (DSP) applications.

While various aspects of the present disclosure have been described with reference to conversion to 16-bit integer for performing complex multiplication, it will be understood that implementations of the present disclosure can include conversion to other fixed-point numbers. By way of example, and not by way of limitation, implementations of the present disclosure include performing the scaling of input signals, multiply, and accumulate operations using 12-bit, 18-bit, or 8-bit integers. More generally, implementations of the present disclosure may include conversion from floating point to fixed integer by converting to ½ half the number of bits of the floating point numbers before performing the complex multiplication in the frequency domain. In yet further implementations, the floating point numbers are converted between ¼ and ¾ the number of bits of the floating point numbers before performing the complex multiplication.

While various aspects of the present disclosure have been described with reference to video game programs played and computed on local console or other computing system, it will be understood that implementations of the present disclosure can include other systems. By way of example and not by way of limitation, implementations of the present disclosure can include cloud computing implementations, wherein operations in accordance with the present disclosure are performed on the cloud and transmitted over a network, particularly if small enough blocks are used.

While various aspects of the present disclosure have been described with reference to single channels (i.e. sound sources) and single instances (i.e. single players), it will be understood that implementations of the present disclosure can include multiple channels (i.e. multiple sound sources) and multiple instances (i.e. multiple players). To implement this, the input signal being convolved with the room impulse response may be a submix of each sound's contribution to the reverberation. Each contribution may be based on distance to the listener: closer sounds contribute less to the room's reverb. Also, the reverb may be overlaid with the direct signal of each sound (dry) so the perception of distance and location is driven by the balance between wet and dry levels as well as panning for the directionality.

While various aspects of the present disclosure have been described with reference to the destruction of a wall or other alterations to a room in a virtual environment that result in altered room impulse response, it will be understood that implementations of the present disclosure can include various other features in order to simulate the changed impulse response of a virtual environment. By way of example and not by way of limitation, implementations of the present disclosure can include application of a gain envelope to the impulse response to simulate the destruction of a room. By way of example, and not by way of limitation, the gain envelope may be applied after performing an FFT in the IR. The FFT of the IR may be done once offline and the envelope may be applied as a gain unique to each partition of the IR in real time. Applying different envelopes in this manner allows re-use of a single IR to synthesize different rooms or geometric alterations to a room.

While various aspects of the present disclosure have been described with reference to frequency domain convolution, it will be understood that implementations of the present disclosure can include other signal processing techniques. By way of example, and not by way of limitation, aspects of the present disclosure can be applied to fixed point transformation techniques, e.g. 16-bit quantization of FFT results.

While various aspects of the present disclosure have been described with reference to the time domain and frequency domain, it will be understood that implementations of the present disclosure can include convolution operations on signals that are functions of other variables.

While the above is a complete description of the preferred embodiments of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "a", or "an" when used in claims containing an open-ended transitional phrase, such as "comprising," refers to a quantity of one or more of the item following the article, except where expressly stated or the context clearly dictates otherwise. Furthermore, the later use of the word "said" or "the" to refer back to the same claim term does not change this meaning, but simply re-invokes that non-singular meaning. The appended claims are not to be interpreted as including means-plus-function limitations or step-plus-function limitations, unless such a limitation is explicitly recited in a given claim using the phrase "means for" or "step for."

What is claimed is:

1. A method, comprising:
    converting a frequency spectrum of a segment of an input signal and a frequency spectrum of a corresponding segment of an impulse response function from a floating point data format to a fixed point integer data format;
    multiplying the converted frequency spectrum of the segment of the input signal with the converted frequency spectrum of the corresponding segment of the impulse response function; and generating a desired convolved signal corresponding to a convolution involving the segment of the input signal and the corresponding segment of the impulse response function in the time domain using multiplication results from said multiplying.

2. The method of claim 1, wherein said input signal is a sound signal and said impulse response function corresponds to an environment in which said sound signal is generated.

3. The method of claim 1, wherein the frequency spectrum of the segment of the input signal and the frequency spectrum of the corresponding segment of the impulse response function are converted from 32-bit floating point format into 16-bit fixed integer format.

4. The method of claim 1, wherein the segment of the input signal is transformed into the frequency domain to generate the frequency spectrum of the segment of the input signal by performing a fast Fourier Transform (FFT) on the segment of the input signal.

5. The method of claim 1, wherein the impulse response function includes a combination of two or more different impulse response functions, wherein the method further comprises scaling the combination of two or more impulse response functions to generate a crossfaded impulse response function.

6. The method of claim 1, wherein the impulse response function is pre-computed, wherein the method further comprises scaling the impulse response function with a floating point operation.

7. The method of claim 1, wherein the spectrum of the impulse response function segment is pre-computed.

8. The method of claim 1, wherein the impulse response function is partitioned into a plurality of time segments of equal size.

9. The method of claim 1, wherein generating said desired convolved signal in the time domain includes:
    scaling said multiplication results from said multiplying;
    accumulating scaled results from said scaling multiplication results; and
    performing an inverse transform on accumulated signals from said accumulating scaled results to generate said desired convolved signal in the time domain.

10. The method of claim 9, further comprising calculating a scale factor for said scaling multiplication results, wherein said calculating the scale factor includes determining a peak in the frequency spectrum of the segment of the input signal, and determining a next power of 2 from the peak.

11. The method of claim 9, wherein the accumulating in said accumulating scaled results is performed in a buffer separate from a delay line of the input signal.

12. The method of claim 9, wherein said scaling multiplication results includes performing a bitwise shift operation on the multiplication results after adding a bit to the multiplication results.

13. The method of claim 9, wherein the accumulating in said accumulating scaled results is performed in a buffer separate from a delay line of the input signal.

14. The method of claim 9, wherein said performing an inverse transform on accumulated signals includes performing an inverse FFT (IFFT) on the accumulated signals.

15. The method of claim 9, wherein the method further comprises scaling the inverse transform of said performing an inverse transform on accumulated signals with a floating point operation.

16. A system comprising:
a processor;
a memory coupled to the processor;
program instructions embodied in the memory an executable by the processor, wherein execution of the program instructions by the processor causes the processor to implement a method, the method comprising:
converting a frequency spectrum of a segment of an input signal and a frequency spectrum of a corresponding segment of an impulse response function from a floating point data format to a fixed point integer data format;
multiplying the converted frequency spectrum of the segment of the input signal with the converted frequency spectrum of the corresponding segment of the impulse response function; and
generating a desired convolved signal corresponding to a convolution involving the segment of the input signal and the corresponding segment of the impulse response function in the time domain using multiplication results from said multiplying the converted frequency spectrum.

17. The system of claim 16, further comprising a speaker coupled to the processor, the method further comprising playing the convolved signal through the speaker.

18. The system of claim 16, wherein said input signal is a sound signal and said impulse response function corresponds to an environment in which said sound signal is generated.

19. The system of claim 16, wherein the frequency spectrum of the segment of the input signal and the frequency spectrum of the corresponding segment of the impulse response function are converted from 32-bit floating point format into 16-bit fixed integer format.

20. The system of claim 16, wherein the segment of the input signal is transformed into the frequency domain to generate the frequency spectrum of the segment of the input signal by performing a fast Fourier transform (FFT) on the segment of the input signal.

21. The system of claim 16, wherein the impulse response function includes a crossfaded signal, wherein the method further comprises scaling a linear combination of a plurality of impulse response functions to generate the crossfaded signal for the impulse response function of said multiplying the frequency spectrum.

22. The system of claim 16, wherein the impulse response function is pre-computed, wherein the method further comprises scaling the impulse response function with a floating point operation.

23. The system of claim 16, further comprising a user interface unit, wherein the input signal includes sounds generated by inputs from the user interface unit.

24. The system of claim 16, wherein generating said desired convolved signal in the time domain includes:
scaling said multiplication results from said multiplying;
accumulating scaled results from said scaling multiplication results; and
performing an inverse transform on accumulated signals from said accumulating scaled results to generate said desired convolved signal in the time domain.

25. The system of claim 24, wherein said scaling multiplication results includes performing a bitwise shift operation on the multiplication results after adding a bit to the multiplication results.

26. The system of claim 24, wherein the accumulating in said accumulating scaled results is performed in a buffer separate from a delay line of the input signal.

27. The system of claim 24, wherein said performing an inverse transform on accumulated signals includes performing an inverse FFT (IFFT) on the accumulated signals.

28. The system of claim 24, wherein said inverse transform on accumulated signals is scaled with a floating point operation.

29. A non-transitory computer readable medium having program instructions, wherein execution of the program instructions by one or more processors causes the one or more processors to perform a method, the method comprising:
converting a frequency spectrum of a segment of an input signal and a frequency spectrum of corresponding segment of an impulse response function from a floating point data format to a fixed point integer data format;
multiplying the converted frequency spectrum of the segment of the input signal with the converted frequency spectrum of a corresponding segment of the impulse response function;
scaling multiplication results from said multiplying the converted frequency spectrum;
accumulating scaled results from said scaling multiplication results; and
performing an inverse transform on accumulated signals from said accumulating scaled results to generate a desired convolved signal corresponding to a convolution involving the segment of the input signal and the corresponding segment of the impulse response function in the time domain.

30. The non-transitory computer readable medium of claim 29, wherein said scaling multiplication results includes performing a bitwise shift operation on the multiplication results after adding a bit to the multiplication results.

* * * * *